(12) United States Patent
Lechner et al.

(10) Patent No.: US 8,021,911 B2
(45) Date of Patent: Sep. 20, 2011

(54) METHOD FOR PRODUCING A PHOTOVOLTAIC MODULE

(75) Inventors: Peter Lechner, Vaterstetten (DE); Walter Psyk, Munich (DE)

(73) Assignee: Schott Solar GmbH, Alzenau (DE)

( * ) Notice: Subject to any disclaimer, the term of this patent is extended or adjusted under 35 U.S.C. 154(b) by 146 days.

(21) Appl. No.: 12/321,195

(22) Filed: Jan. 16, 2009

(65) Prior Publication Data
US 2009/0186442 A1   Jul. 23, 2009

(30) Foreign Application Priority Data
Jan. 19, 2008  (DE) .......................... 10 2008 005 284

(51) Int. Cl.
*H01L 21/00*   (2006.01)
(52) U.S. Cl. ................................. 438/73; 257/E21.347
(58) Field of Classification Search .................. 438/73, 438/80; 136/244, 256, 259; 257/E21.347
See application file for complete search history.

(56) References Cited

U.S. PATENT DOCUMENTS

| 4,292,092 A | 9/1981 | Hanak |
| 4,532,371 A * | 7/1985 | Hanak et al. ................... 136/249 |
| 4,650,524 A | 3/1987 | Kiyama et al. |
| 5,254,179 A * | 10/1993 | Ricaud et al. ................. 136/244 |
| 7,259,321 B2 * | 8/2007 | Oswald et al. ................ 136/244 |
| 7,883,924 B2 * | 2/2011 | Lechner et al. ................. 438/65 |
| 2003/0044539 A1 | 3/2003 | Oswald |

FOREIGN PATENT DOCUMENTS
DE  31 21 350 C2   7/1982
DE  199 33 703 A1  10/2000
* cited by examiner

*Primary Examiner* — Matthew Smith
*Assistant Examiner* — Christine Enad
(74) *Attorney, Agent, or Firm* — Miller Canfield Paddock and Stone; Mark L. Maki

(57) ABSTRACT

For producing a photovoltaic module (1), the front electrode layer (3), the semi-conductor layer (4) and the back electrode layer (5) are patterned by separating lines (6, 7, 8) to form series-connected cells ($C_1, C_2, \ldots C_n, C_{n+1}$). The patterning of the front electrode layer (3) and of the semiconductor layer (4) is done with a laser (13) emitting infrared radiation. During patterning of the semiconductor layer (4) the power of the laser (13) is so reduced that the front electrode layer (3) is not damaged.

14 Claims, 2 Drawing Sheets

METHOD FOR PRODUCING A PHOTOVOLTAIC MODULE

Figure 1:
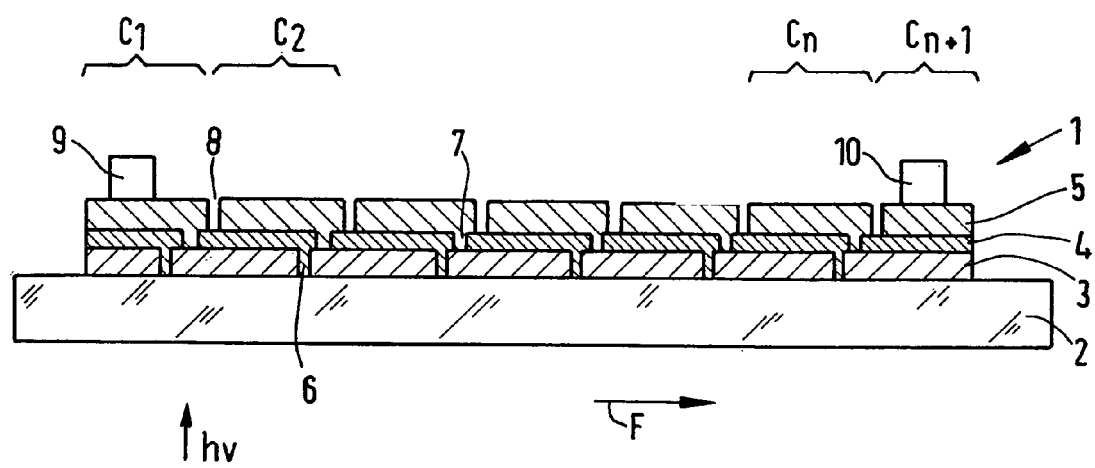

This invention relates to a method for producing a photovoltaic module according to the preamble of claim 1.

In the production of a photovoltaic module there are deposited over a large area on a transparent, electrically insulating substrate, for example a glass plate, three functional layers, namely, a transparent front electrode layer, a semiconductor thin-film layer and a back electrode layer.

To form series-connected cells from these monolithic layers, the layers are patterned by separating lines e.g. with a laser, by mechanical methods or by chemical means.

For patterning the front electrode layer, which consists for example of a transparent, electrically conductive metal oxide, for example tin oxide, it is customary to use laser technology. The laser used is typically a neodymium doped yttrium aluminum garnet (Nd:YAG) or a neodymium doped yttrium vanadate (Nd:YVO$_4$) solid-state laser which emits infrared radiation with a wavelength of 1064 nm. At this wavelength the transparent tin oxide front electrode layer has an optical absorption of several percent.

The patterning of the semiconductor layer, for example a silicon thin film, is likewise typically done with laser technology. The laser used is a double-frequency Nd:YAG or Nd:YVO$_4$ solid-state laser which thus emits laser light with a wavelength of 532 nm in the visible range.

At this wavelength the silicon thin film possesses high optical absorbance in comparison with the transparent front electrode layer. This permits selective ablation of the semiconductor layer without impairing the front electrode layer.

The patterning of the back electrode layer is done using mechanical methods, such as the "lift-off" technique wherein an adhesive paste is applied to the semiconductor layer in the areas where the back electrode layer is to be provided with separating lines and then stripped to remove the back electrode layer in said areas, but also using laser processes.

In the patterning of the semiconductor thin-film layer, the separating lines are produced in the semiconductor layer with the laser with a wavelength of 532 nm, thereby exposing the front electrode layer located therebelow. When the back electrode layer is then deposited, the back electrode layer is contacted with the front electrode layer through the separating lines of the semiconductor layer, thereby causing the cells of the photovoltaic module to be series-connected.

The production of the photovoltaic module requires a plurality of costly machines. The machine for semiconductor coating involves the highest investment costs. Also, the machine with the laser emitting infrared radiation for patterning the front electrode layer and the further machine with the laser emitting visible irradiation for patterning the semiconductor layer are important cost factors.

The capacity of the semiconductor coating machine and the capacity of the two laser machines are usually different. It is usually desirable to attain a 100 percent utilization of the semiconductor coating machine as the costliest machine.

If the semiconductor coating machine can for example perform a coating of at most 200,000 modules a year, but each laser machine for the front electrode layer and semiconductor layer patterning can be used for example only for at most 80,000 modules a year in each case, this has the consequence that altogether six costly laser machines must be procured because the capacity of one pair of laser machines with 160,000 modules a year does not suffice. The number of laser machines thus leads to a considerable cost problem in the industrial production of photovoltaic modules.

It is therefore the object of the invention to considerably reduce costs for the industrial production of photovoltaic modules.

This is achieved according to the invention by using the laser used for patterning the front electrode layer for patterning the semiconductor layer as well.

For it has been found that the semiconductor layer, for example a silicon layer, can be removed with the laser even when the laser emits radiation that is absorbed by the transparent front electrode layer but not by the semiconductor layer.

For the absorption of the laser radiation by the front electrode layer has the consequence that the front electrode layer heats up such that the semiconductor layer located thereabove is thermally removed and thus a separating line is formed in the semiconductor layer.

It is essential, however, that when the laser is used for patterning the semi-conductor layer, its power is so reduced that the front electrode layer is ideally not damaged, i.e. broken or otherwise impaired. This is possible because the front electrode layer is thermally more stable than the semiconductor layer. However, the laser power can be so increased that the front electrode layer is selectively damaged or otherwise changed in order to permit e.g. fluctuations of layer properties to be offset.

This means that while the laser is used possibly at full power, but at least at high power, for patterning the front electrode layer, a lower laser power is adjusted for patterning the semiconductor layer, so that the semiconductor layer is removed but the thermally more stable front electrode layer remains.

Since the invention permits one and the same laser machine to be used both for patterning the front electrode layer and for patterning the semiconductor layer, the invention permits the number of laser machines to be reduced in the industrial production of photovoltaic modules. This means that if, according to the example described at the outset, the semiconductor coating machine has a maximum capacity of 200,000 modules a year, it suffices according to the invention to use five lasers with a maximum capacity of 80,000 modules a year each, so that one laser machine can be saved compared to the prior art.

Likewise, the redundancy of the laser patterning processes according to the invention ensures substantially higher flexibility and total plant availability in production. in case of maintenance or malfunction of one laser patterning machine (e.g. for the front electrode layer) it is possible, due to the redundancy, for laser machines for patterning the semiconductor thin-film layer to perform the processes for patterning the front electrode layer.

The front electrode layer can consist of an electrically conductive metal oxide, for example tin oxide ($SnO_2$), in particular fluorine doped tin oxide or another material. It is only essential that it is transparent and electrically conductive, absorbs at least part, preferably 0.5%, in particular at least 2%, of the emitted infrared radiation of the laser and is furthermore thermally more stable than the semiconductor layer.

According to the inventive method, the separating lines are thus first produced with the laser at high power in the front electrode layer deposited on the transparent substrate, for example a glass plate, for patterning the front electrode layer. On the patterned front electrode layer there is subsequently applied the semiconductor layer by vapor deposition for example.

The semiconductor layer can consist of silicon, for example amorphous, nano-, micro- or polycrystalline silicon or another semiconductor, for example cadmium tellurium.

The laser used is preferably a solid-state laser emitting infrared radiation, that is, a laser with a wavelength of at least 800 nm, in particular 1000 nm and more. The solid-state laser emitting in particular in the near infrared range can be a fiber laser or a disk laser.

The solid-state laser is preferably a YAG laser, i.e. it has yttrium aluminum garnet as the host crystal. Instead, the host crystal can also be yttrium vanadate ($YVO_4$). For doping it is preferable to employ neodymium, i.e. to use a solid-state laser with a wavelength of 1064 nm. It is also possible to use erbium, ytterbium or a different rare earth metal for doping. Neodymium doped YAG lasers (Nd:YAG lasers) or neodymium doped yttrium vanadate lasers ($Nd:YVO_4$ lasers) are preferred.

For patterning the semiconductor layer it is possible to direct the laser beam through the transparent substrate onto the front electrode layer and semiconductor layer. Instead it is also possible to perform the patterning of the semiconductor layer such that the laser beam is directed from the other side, i.e. directly onto the semiconductor layer.

It is thereby possible to produce in the semiconductor layer a separating line with a width of for example 10 to 100 μm which exposes the front electrode layer located thereabove. The semiconductor layer is subsequently coated for example by sputtering with the back electrode layer which is then in turn patterned for example by "lift-off" technology or a laser process. This forms cells, which are series-connected, from the functional layers, that is, the front electrode layer, the semiconductor layer and the back electrode layer. This means that the back electrode layer of one cell contacts the front electrode layer of the adjacent cell through the separating lines in the semiconductor layer.

The patterning of the semiconductor thin-film layer can be done either in the continuous mode of the laser (CW mode) or in pulsed mode, for example with a Q switch (Q switch mode).

According to the invention, the energy of the laser is absorbed by the front electrode layer and transferred to the semiconductor thin-film layer by heat conduction.

When the laser beam is coupled through the transparent substrate into the front electrode layer and the semiconductor layer to form the separating lines in the semiconductor layer, the semiconductor layer is presumably burned off, but in any case removed thermomechanically. Melt residue might be ascertained on the edge of the grooves forming the separating lines in the semiconductor layer. The separating line has wavy or sharply limited edges depending on the operating mode of the laser, CW or QS mode. When the laser beam is focused directly on the semiconductor layer, the separating line is also produced thermomechanically.

It is characteristic of the inventive method that when the laser power is so reduced that the semiconductor thin-film layer is removed but ideally there is no damage done to the front electrode layer, the semiconductor layer is not removed in places where there is no front electrode layer located therebelow, for example in the case of crossing separating lines in the front electrode layer. This can be considered further proof that the absorption of laser radiation by the front electrode layer is causal for removal of the semiconductor layer located thereabove. However, to permit e.g. fluctuations of layer properties to be offset, the laser power can be so increased after the patterning of the semiconductor layer that the front electrode layer is selectively damaged without influencing the property of the separating line in the semiconductor layer.

Hereinafter the invention will be explained in more detail by way of example with reference to the enclosed drawing. Therein are shown schematically in longitudinal section:

FIG. 1 a photovoltaic module; and

FIGS. 2a to 2e stages in the production of the photovoltaic module according to FIG. 1.

According to FIG. 1, the photovoltaic module 1 has a transparent substrate 2, for example a glass plate, having deposited thereon, one on the other, three functional layers, namely, a transparent front electrode layer 3, a semiconductor thin-film layer 4 and a back electrode layer 5.

The module 1 comprises individual strip-shaped cells $C_1$, $C_2, \ldots C_n, C_{n+1}$ which are series-connected. For this purpose the front electrode layer 3 is interrupted by separating lines 6, the semiconductor layer 4 by separating lines 7, and the back electrode layer 5 by separating lines 8 which extend perpendicular to the current flow direction F of the module 1.

The back electrode layer 5 of one cell $C_1, \ldots C_n$ thus contacts the front electrode layer 3 of the adjacent cell $C_2, \ldots C_{n+1}$ through the separating lines 7 in the semiconductor layer 4. The current produced by the photovoltaic module is collected by the contacts 9, 10 on the outermost cells $C_1$ and $C_{n+1}$.

Figure 2A:
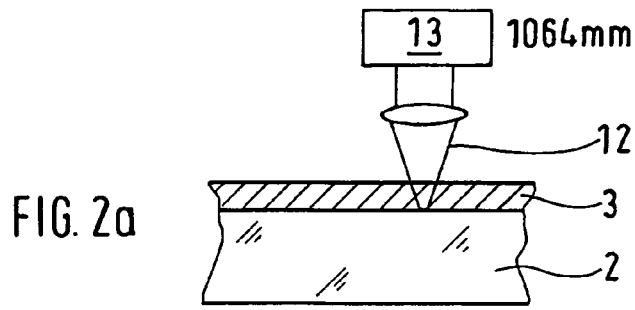
Figure 2B:
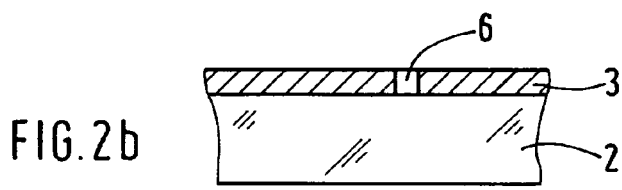
Figure 2C:
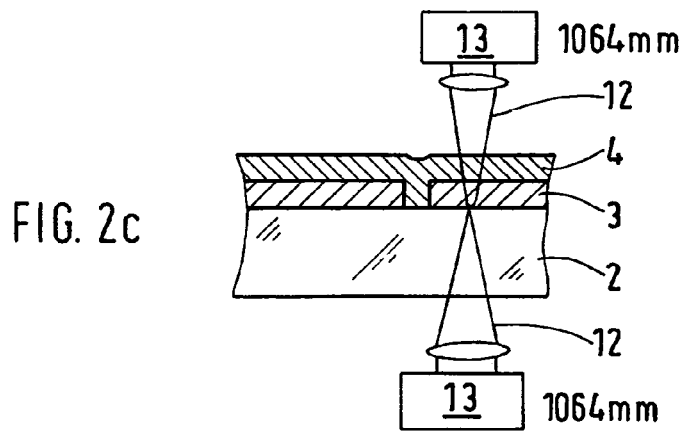
Figure 2D:
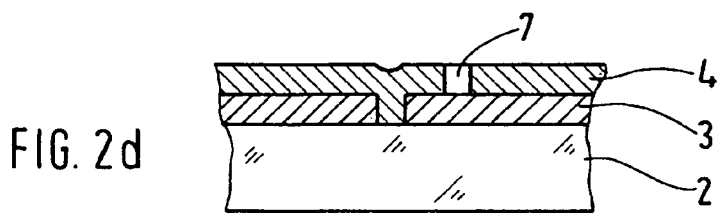
Figure 2E:
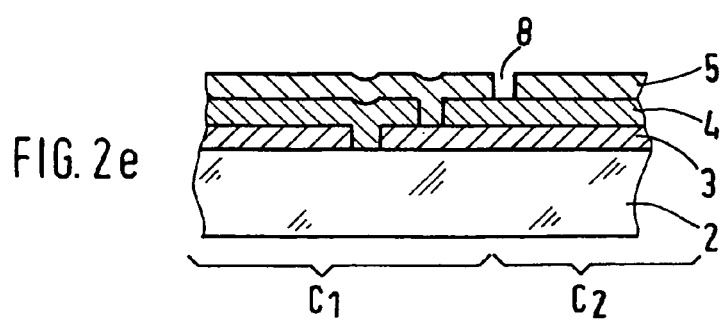

FIG. 2e shows the series connection of two cells by the example of the cells $C_1$ and $C_2$ according to FIG. 1. According to FIGS. 2a to 2d the series-connected cells $C_1$ and $C_2$ are produced as follows.

Based on a glass substrate 2 coated with the front electrode layer 3 the separating lines 6 are produced in the front electrode layer 3 consisting e.g. of tin oxide with the focused laser beam 12 of a laser 13 which emits infrared radiation, for example an Nd:YAG or $Nd:YVO_4$ laser with a wavelength of 1064 nm. The laser 13 is adjusted to a high power here so that the front electrode layer 3 which absorbs laser radiation of this wavelength melts and/or evaporates in the area of the separating lines 6.

In FIG. 2a the laser beam 12 is directed onto the front electrode layer 3 directly. However, the patterning can also be performed with a laser beam from the other side, i.e. through the glass substrate 2.

On the patterned front electrode layer 3 according to FIG. 2b, the semiconductor layer 4, consisting for example of silicon, is then deposited e.g. by chemical vapor deposition.

According to FIG. 2c, the laser 13 emitting the same infrared radiation, for example an Nd:YAG or $Nd:YVO_4$ laser with a wavelength of 1064 nm, is used for patterning the semiconductor layer 4. The laser beam 12 can be directed onto the two layers 3 and 4 in the area where the separating lines 7 are to be formed for patterning the semiconductor layer 4, as illustrated in FIG. 2c by the laser 13 disposed over the semiconductor layer 4, or through the glass substrate 2, as illustrated in FIG. 2c by the laser 13 disposed under the glass substrate 2.

Although the semiconductor layer 4 absorbs no, or very little, radiation of this wavelength, there is predominantly an absorption of the laser radiation 12 of the laser 13 by the front electrode layer 3 located therebelow, which thereby heats up thermally such that the thermally less stable semiconductor layer 4 is removed so as to form the separating lines 7, thereby exposing the front electrode layer 3 in this area. To avoid damaging the front electrode layer 3, the power of the laser 13 is accordingly reduced during this process. However, the laser power can be so increased that the front electrode layer 3 is selectively damaged to permit e.g. fluctuations of layer properties to be offset. The laser power can thus be so increased, without impairing the properties of the separating groove, that is, the separating line 7, in the semiconductor layer 4

(contact surface for the back electrode), that the front electrode layer is damaged by selectively increasing the laser power.

The patterned semiconductor layer 4 (FIG. 2d) is subsequently coated e.g. by sputtering with the back electrode layer 5, which is then in turn patterned for example by a "lift-off" method for forming the separating lines 8 (FIG. 2e).

The invention claimed is:

1. A method for producing a photovoltaic module, wherein there are deposited on a transparent substrate a transparent front electrode layer, a semiconductor layer and a back electrode layer which are patterned by separating lines to form series-connected cells, comprising the steps of laser patterning the front electrode layer with a laser that emits infrared radiation and laser patterning the semiconductor layer with the same laser used in a continuous mode to provide a continuous wave of infrared radiation, the power of the laser being so reduced during patterning of the semiconductor layer that the front electrode layer is not damaged.

2. The method according to claim 1, wherein the laser has a wavelength at which the optical absorption of the front electrode layer is at least 0.5%.

3. The method according to claim 1, wherein the laser comprises a neodymium doped solid-state laser with a wavelength of 1064 nm.

4. The method according to claim 3, wherein the laser comprises an yttrium aluminum garnet laser or an yttrium vanadate laser.

5. The method according to claim 3, wherein the laser comprises a neodymium doped yttrium aluminum garnet laser or a neodymium doped yttrium vanadate laser.

6. The method according to claim 1, wherein for patterning the semiconductor layer, the laser beam is directed through the transparent substrate onto the front electrode layer and the semiconductor layer or directly onto the semiconductor layer.

7. The method according to claim 1, wherein after the patterning of the semiconductor layer, the power of the laser is increased in order to selectively change the front electrode layer without influencing the properties of the separating line in the semiconductor layer.

8. A method for producing a photovoltaic module having series-connected cells, comprising the steps of:
   depositing a front electrode layer onto a transparent substrate;
   applying infrared radiation with a laser for laser patterning of the front electrode layer to form separating lines;
   depositing a semiconductor layer onto the front electrode layer so that the thin film layer contacts the transparent substrate at the pattern of the front electrode layer;
   applying a continuous wave of infrared radiation with the same laser for laser patterning the semiconductor layer to form separating lines that expose the front electrode layer, the power of the infrared radiation output by the laser being reduced relative to the power applied by the laser during patterning of the front electrode layer and the infrared radiation being provided as a continuous wave to prevent damage to the front electrode layer during patterning of the semiconductor layer;
   depositing a back electrode layer onto the patterned semiconductor layer so that the back electrode layer contacts the front electrode layer at the pattern of the semiconductor layer; and
   patterning the back electrode layer to form separating lines therein.

9. The method according to claim 8, wherein the laser has a wavelength at which the optical absorption of the front electrode layer is at least 0.5%.

10. The method according to claim 8, wherein the laser comprises a neodymium doped solid-state laser with a wavelength of 1064 nm.

11. The method according to claim 8, wherein for patterning the semiconductor layer, the applied continuous wave of infrared radiation is directed through the transparent substrate onto the front electrode and the semiconductor layer, or the infrared radiation is provided directly onto the semiconductor layer.

12. The method according to claim 8, wherein, after the patterning of the semiconductor layer, the power of the laser is increased in order to selectively change the front electrode layer without influencing the properties of the separating lines in the semiconductor layer.

13. The method according to claim 8, wherein the step of patterning the back electrode layer comprises applying laser radiation onto the back electrode layer directly, or onto the back electrode layer through the front electrode layer and the semiconductor layer, for laser patterning of the back electrode layer to form the separating lines therein.

14. The method according to claim 8, wherein the step of patterning the back electrode layer comprises applying an adhesive paste to the semiconductor layer in areas where the back electrode layer is to be provided with the separating lines and stripping the adhesive paste to remove the back electrode layer in the areas to form the separating lines.

* * * * *